United States Patent [19]
Le

[11] Patent Number: 5,500,603
[45] Date of Patent: Mar. 19, 1996

[54] METHODOLOGY TO QUICKLY ISOLATE FUNCTIONAL FAILURES ASSOCIATED WITH INTEGRATED CIRCUIT MANUFACTURING DEFECTS

[75] Inventor: Tam T. Le, Garland, Tex.

[73] Assignee: SGS-Thomson Microelectronics, Inc., Carrollton, Tex.

[21] Appl. No.: 299,238

[22] Filed: Aug. 31, 1994

[51] Int. Cl.$^6$ .......................... G01R 31/28; G06F 11/00
[52] U.S. Cl. .......................... 324/751; 324/73.1
[58] Field of Search .......................... 324/763, 73 R; 437/51

[56] References Cited

U.S. PATENT DOCUMENTS

| | | | |
|---|---|---|---|
| 4,053,833 | 10/1977 | Malmberg et al. | 324/763 |
| 5,053,699 | 10/1991 | Aton | 324/73.1 |
| 5,068,605 | 11/1991 | Yasunga et al. | 324/73.1 |
| 5,208,178 | 5/1993 | Usami | 437/51 |

Primary Examiner—Kenneth A. Wieder
Assistant Examiner—Barry Bowser
Attorney, Agent, or Firm—Renee M. Larson; Lisa K. Jorgenson; Richard K. Robinson

[57] ABSTRACT

According to the present invention, the functionality and possible process-related defects of an integrated circuit device are quickly assessed and isolated using a special testing methodology. Utilizing a test chip, an Electron Beam (E-Beam) is used to locate defective circuitry of the integrated circuit at functional levels, and an emission microscope is used to locate possible DC leakage related to silicon which is indicative of process-related defects. Using the methodology of the present invention on a test chip rather than a real production device means that the functional analysis time may be reduced from weeks to less than one hour.

20 Claims, 3 Drawing Sheets

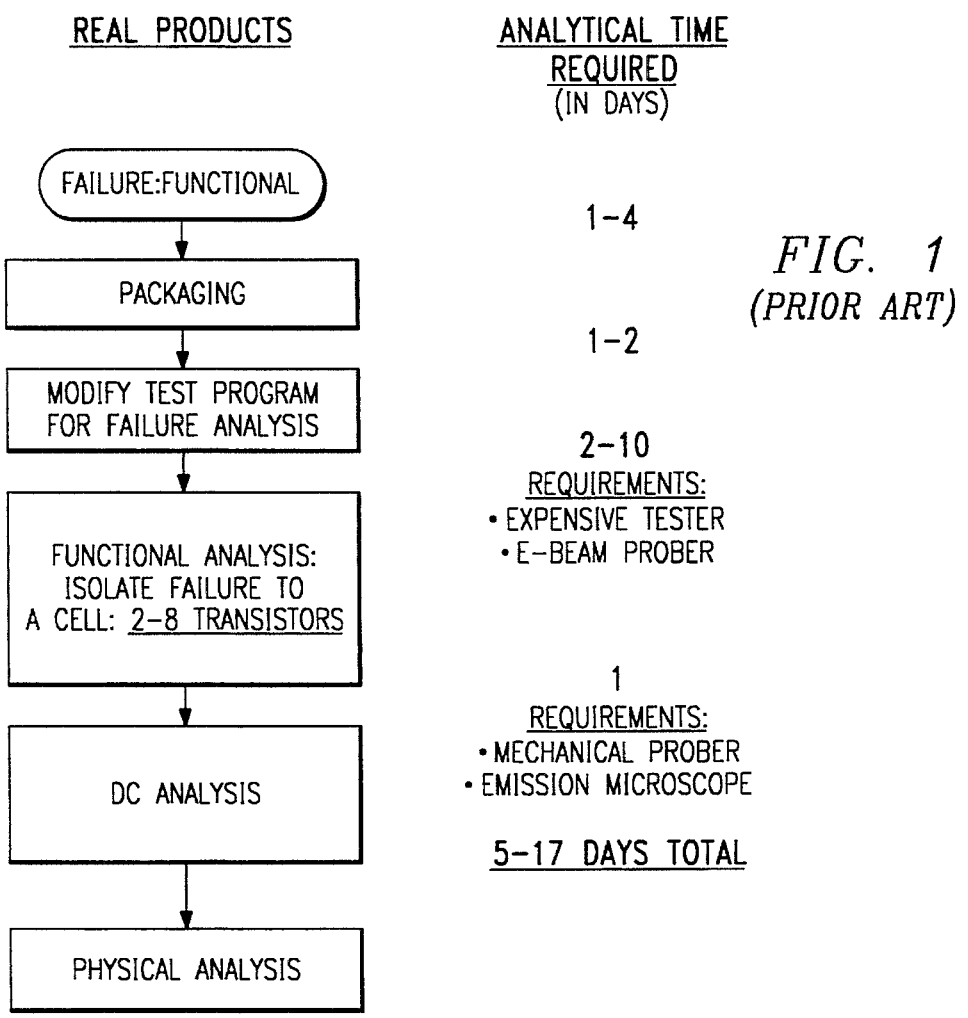
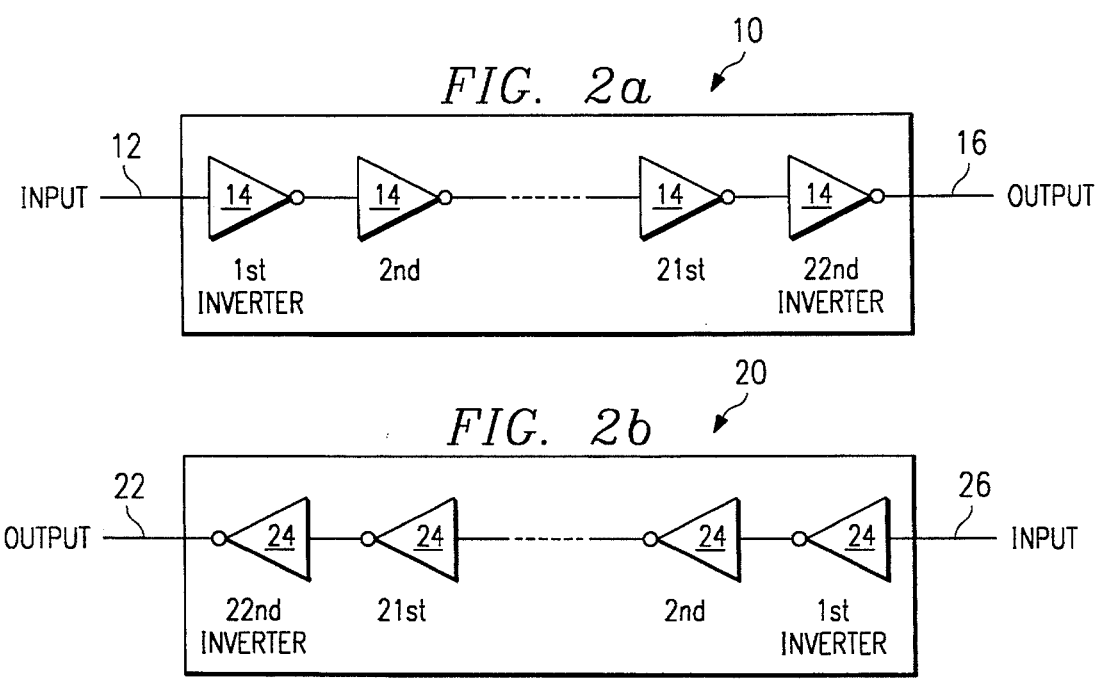

METHODOLOGY TO QUICKLY ISOLATE FUNCTIONAL FAILURES ASSOCIATED WITH INTEGRATED CIRCUIT MANUFACTURING DEFECTS

BACKGROUND OF THE INVENTION

The present invention relates generally to integrated circuit devices, and more specifically to functional failures associated with integrated circuit device process-related manufacturing defects.

As Very Large Scale Integration (VLSI) and Ultra Large Scale Integration (ULSI) technologies have quickly advanced in the past decade, the size, configuration, and complexity of VLSI and ULSI integrated circuit devices have increased and improved at a correspondingly fast rate. Application Specific Integrated Circuit (ASIC) Sea-of-Gate devices, characterized by a vast number of transistors manufactured according to the same process with no customer personalization, have seen especially meaningful advancements. For instance, the typical die size of ASIC Sea-of-Gate devices has increased from 300 $kmil^2$ to 700 $kmil^2$, gate count capability has increased from 2,000 to 800,000 gates, the number of conductor layers has increased from 3 to 5 layers, the number of signal pins has increased from 100 to 400 pins, while the transistor size has decreased from 3 µm to 0.5 µm, all within the last ten years. Together, these improvements represent an increased complexity on the order of four magnitudes when comparing ASIC Sea-of-Gate devices of today with those of 1984.

In addition to this increased complexity, the design specifications of Sea-of-Gate devices are typically proprietary and thus not shared with the manufacturer of Sea-of-Gate devices. This lack of knowledge serves to further complicate the device manufacturer's debugging of process-related problems such as interconnect problems with contacts and vias, conductor layer problems with the polysilicon and metal lines, and insulator problems with the gate oxide and interlevel dielectric, all of which may cause low yield. And, in reality, the increasing complexity and lack of knowledge of Sea-of-Gate devices have cost the manufacturer an enormous amounts of resources, equipment, and time with regard to the functional failure analyses which are performed in response to line yield fallout, qualification failures, and customer device returns. The analysis requires both a high level of engineering expertise and state-of-the-art test equipment, such as high cost device testers. Additionally, even when these resources are brought to bear, it may be weeks before the functional failure analysis is complete and test results become available.

Examination of a typical process flow and the required time and equipment may help to illustrate the enormous amount of resources which must currently be dedicated to identifying and assessing process-related functional failures of an integrated circuit device. Referring to FIG. 1, a flow chart of a representative process currently used for functional failure analysis is shown. Packaging of the integrated circuit device typically takes one to four days. This is followed by modification of the device test program for failure analysis of the device which typically takes from one to two days. This is followed by the actual functional analysis of the device where any failures are only isolated to a cell which may have anywhere from two to eight transistors. Actual functional analysis of the device requires the use of an expensive tester and E-Beam Prober, and can take from two to ten days to complete. Next, DC (Direct Current) analysis of the device is performed; DC analysis requires the use of a mechanical prober as well as an emission microscope, and typically takes up to one day. Thus, it can be seen that functional failure analysis, as is currently done in the art, can take a total of anywhere from five to seventeen days and requires the use of expensive equipment, such as testers and probers. Additionally, typical functional analysis only pinpoints the cause of functional failure to a cell which may have as many as 8 transistors. Thus, it is currently difficult to ascribe process-related failures to a small number of transistors with certainty.

Thus, there is a current need in the art to decrease the quantity and quality of resources utilized during functional failure analysis of integrated circuit device, such as Sea-of-Gate ASIC devices. This means decreasing the level of technical expertise, the use of high cost equipment, and the time required to isolate process-related defects of integrated circuit devices.

SUMMARY OF THE INVENTION

It would be advantageous in the art to quickly assess the functionality of an integrated circuit device.

It would further be advantageous in the art to quickly isolate process-related defects of integrated circuit devices related to the interconnects, conductor layers, and insulator of the device.

Therefore, according to the present invention, the functionality and possible process-related defects of an integrated circuit device are quickly assessed and isolated using a special testing methodology. Utilizing a test chip, an Electron Beam (E-Beam) is used to locate defective circuitry of the integrated circuit at functional levels, and an emission microscope is used to locate possible DC leakage related to silicon which is indicative of process-related defects. Using the methodology of the present invention on a test chip rather than a real production device means that the functional analysis time may be reduced from weeks to less than one hour.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1 is a flow chart of the functional analysis of an integrated circuit device, according to the prior art;

FIG. 2a is a first embodiment of a building block cell, according to the present invention;

FIG. 2b is a second embodiment of a building block cell, according to the present invention;

DESCRIPTION OF THE INVENTION

Figure 3:
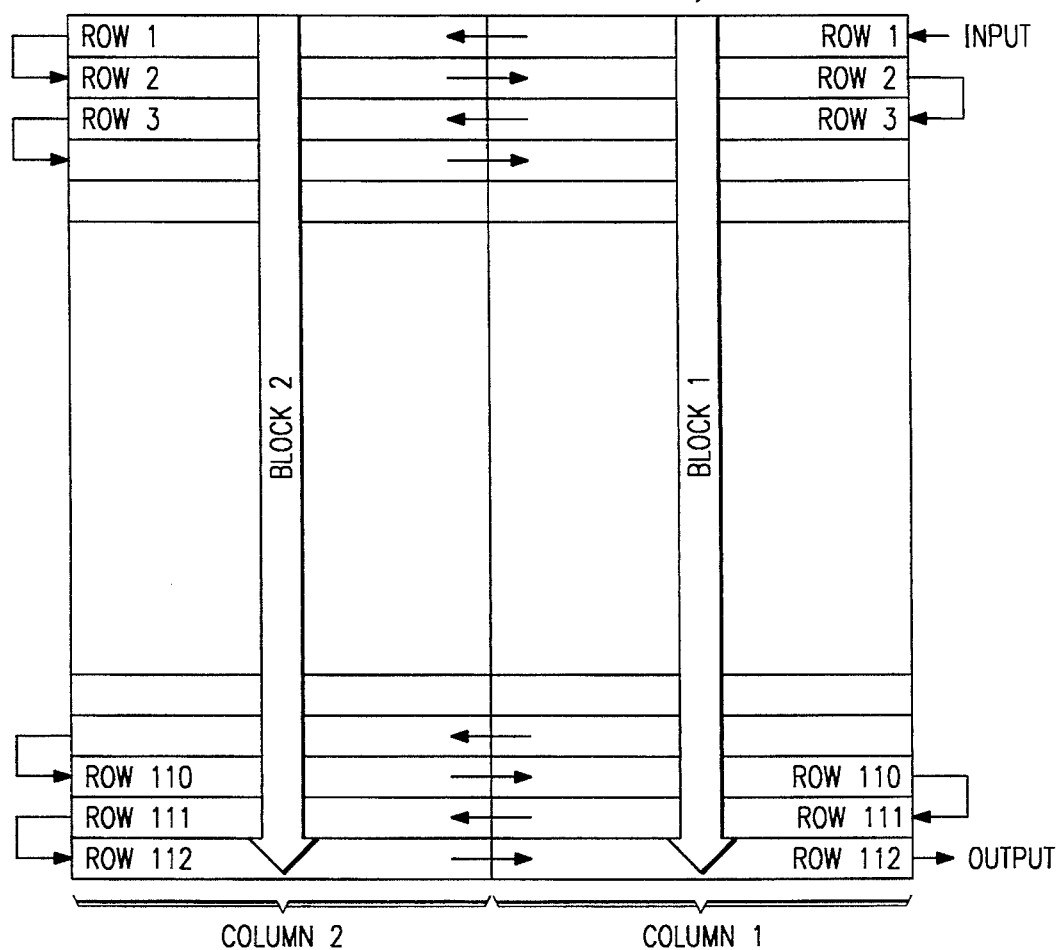
FIG. 3 is a block diagram showing the organization of a test chip, according to the present invention.

A methodology for quickly assessing the functionality of an integrated circuit device and isolating defective circuitry of the integrated circuit device, according to the present invention, is implemented with a test chip. Using an Electron Beam (E-Beam) and this test chip, rather than an actual integrated circuit device, the time required by the device manufacturer to locate a defective electrical node, comprised of only two transistors, on the device is reduced from a matter of weeks for a real device to less than one hour. This represents a vast improvement over the prior art where it was only possible to isolate a functional failure to a cell having anywhere from 2 to 8 transistors. Additionally, the test chip may be appropriately programmed in order to quickly assess the front-end defect density of integrated circuit devices; an emission microscope is used to locate possible DC leakage related to silicon which is indicative of process-related defects. Defect density of an integrated circuit device is process-related and thus may be indicative of problems in the following areas: device interconnects such as contacts and vias, device conductor layers such as polysilicon and metal lines, and device insulators such as the gate oxide and interlevel dielectric.

The test chip is processed with normal production lots and is programmed according to the level of resolution of measured defect density which is desired. For instance, a Sea-of-Gates ASIC test chip having 123,200 inverters may be programmed to be in a single chain mode characterized as a single inverter chain comprised of all 123,200 inverters connected together serially which has a single input and a single output. This single chain mode may be used to provide a quick functional status of the device. Alternately, the test chip may be programmed in a multiple chain mode to be a device having two or more inverter chains, in which case the device would be characterized as having one input and multiple outputs, with each inverter chain generating its own output. This multiple chain mode provides a much greater resolution of the defect density of the device, defined as the number of failures per wafer over the area of the die. Programming the test chip may be accomplished by setting a control pin on the test chip to a first logic level for the single chain mode and to a second logic level for the multiple chain mode, as will be described more fully.

The test methodology of the present invention is implemented using a test chip, such as the Sea-of-Gates based ASIC test chip. It is important to note that any one of a number of types of test chips, such as ASIC and custom test chips, having a plurality of elements such as inverters may be used to support the test methodology of the present invention. However, in order to more fully describe the present invention, a test chip comprised of 123,200 inverters which form an inverter chain(s) will now be described. The inverters of the long inverter chain are arranged in rows, and each row of inverters has test points at the middle and both ends of the row in order to provide observability at test. The test chip is entirely asynchronous and has no latched signals.

The basic building block of the test chip is a cell which contains 22 inverters which are connected in series and implemented in a 36 cell layout. The inverters may be connected such that the input signal to the cell propagates in a left to right direction or in a right to left direction to the cell output signal. The physical layout of the basic building block cell is illustrated in the alternate embodiments of FIG. 2a and FIG. 2b. Referring to cell 10 of FIG. 2a, input signal 12 propagates in a left to right direction through a total of twenty-two inverters 14 to output signal 16; input signal 12 is on the left side of cell 10 while output signal 16 is on the right side of cell 10. Alternately, cell 20 of FIG. 2b demonstrates a right to left propagation of input signal 22 through a total of twenty-two inverters 24 to output signal 26; input signal 22 is on the right side of cell 20 while output signal 26 is on the left side of cell 20.

Referring to FIG. 3, the organization of the test chip with respect to row and column structure is shown. Test chip 30 is comprised of a plurality of rows and columns; in this example, 112 rows and 2 columns are shown. The 123,200 inverters of the test chip are organized in the following manner. Each row, Row 1, Row 2, Row 3 . . . Row 112, spans both Block 1 and Block 2 as shown in FIG. 3. Each block contains 25 serially connected cells of the type shown as Cell 10 and Cell 20 in FIGS. 2a and 2b, respectively. Thus, a row, such as Row 1 or Row 112, spans Block 1 and Block 2 and contains 50 serially connected cells or 1100 inverters. Each row of inverters is serially connected to the subsequent row, thereby forming a serpentine inverter chain which runs for 112 rows for a total of 123,200 inverters in the serpentine chain. For instance, Row 1 is serially connected to Row 2 which is serially connected to Row 3, and so forth. This serial connection proceeds in the same fashion for all 112 rows. The column structure of test chip 30 is likewise characterized as being serially connected. Test chip 30 is comprised of Column 1 which contains Block 1 and Columns 2 which contains Block 2. The output signal of Block 1 is connected to Block 2, whose output signal is brought to an output buffer for testability reasons.

Figure 4:
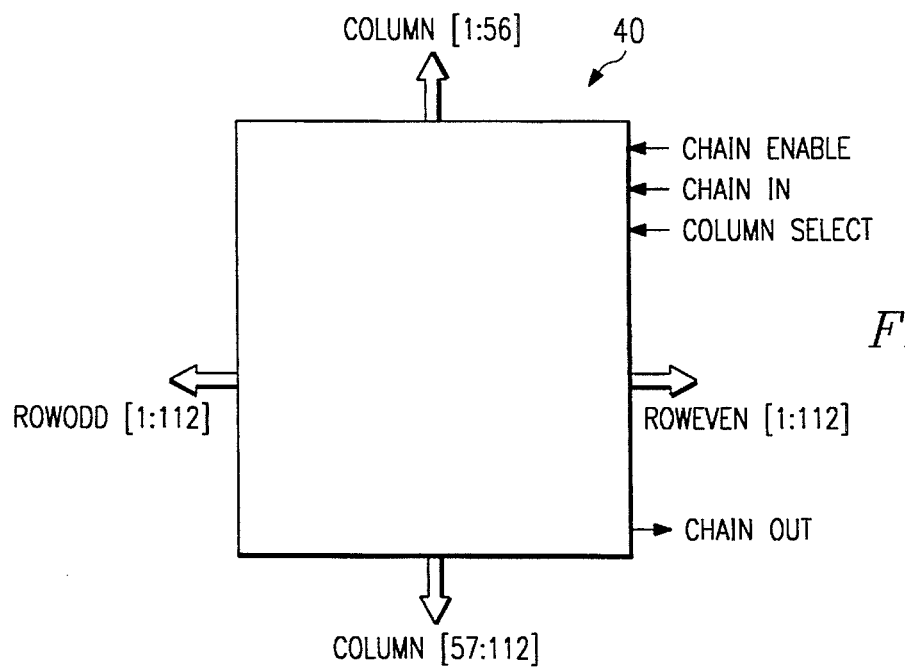
FIG. 4 is the pinout of a test chip, according to the present invention.

Referring now to FIG. 4, the pinout 40 of the test chip is shown. The pinout 40 is characterized by the following input signal pins: Chain In, Chain Enable, Column Select; and the following output signal pins: Chain Out, Column<1:56>, Column<57:112>, RowEven<>, and RowOdd<1:112>. A signal presented to the Chain In pin drives the inverter chain of the test chip. A signal presented to the Chain Enable pin determines whether the test chip will remain in the default single chain mode or operate in the multiple chain mode. A high logic signal applied to the Chain Enable pin maintains the test chip in the default single chain mode having one input signal on the Chain In pin and one output signal on the Chain Out pin, whereas a low logic signal applied to the Chain Enable pin puts the test chip into the multiple chain mode. According to this example, then, the multiple chain mode causes the inverters of the inverter chain to be broken up into 224 separate inverter chains, with each inverter comprised of 550 inverters; each column, then, has 112 inverter chains. The multiple chain mode is thus characterized as having one input signal on the Chain In pin and multiple output signals on the Column<1:56>, Column<57:112>, RowEven<1:112>, and RowOdd<1:112> output pins. The number and length of the inverter chains may vary greatly as a function of the size of the test chip die.

When the signal on the Chain Enable pin is asserted low and is therefore indicative of a multiple chain mode, then applying the proper logic level to the Column Select pin determines whether the output signals on the Column output pin will be representative of the signals at the middle of the odd (Block 1) rows or the even (Block 2) rows. As shown in FIG. 4, Row 2, Row 4 etc. are even rows while Row 1, Row 3, etc. are odd rows. When a low logic signal is applied to the Column Select pin, the output signals on the Column<1:56> and Column<57:112> pins are representative of the signals at the middle of the odd rows (Block1). Conversely, when a high logic signal is applied to the Column Select pin, the output signals on the Column<1:56> and Column<57:112> pins are representative of the signals at the middle of the even rows (Block 2). The signals on the RowEven<1:112> output pin represent the signals at the end of each even row, while the signals on the RowOdd<1:112> output pin represent the signals at the end of each odd row. The signal on the Chain Out pin represents the output of the inverter chain; in order for the test chip to generate just this one output signal, the Chain Enable pin must be asserted in the default high logic level.

As previously noted, when the Chain Enable input pin is asserted low, the test chip is put in a multiple chain mode and the signal on the Chain In input pin drives each row associated with a particular column in parallel. At the same time the test chip is placed in a multiple chain mode, the signals on RowEven<1:112>, RowOdd<1:112>, Column<1:56> and Column<57:112> output pins are switched from a tri-state to an output mode and thus enabled. The result is that the multiple inverter chain signals at the middle of each row are observable through the output signals on the Column pin and that the multiple inverter chain signals at the end of each row are observable through the output signals on the RowOdd<1:112> and RowEven<1:112> output pins.

When the Chain Enable input pin is asserted high, the test chip is maintained in the default single chain mode. In the single chain mode, all 123,200 inverters of the test chip are serially connected and driven by the signal presented to the Chain In input pin. The output signal of this long, single chain is only observable as the signal on the Chain Out output pin. When in the single chain mode, all other output pins, including the Column<1:56>, Column<57:112>, RowOdd<1:112>, and RowEven<1:112> pins are tri-stated.

The following truth table summarizes the test chip operation:

| Chain In | Chain Enable | Column Select | Chain Out | RowEven | RowOdd | Column |
|---|---|---|---|---|---|---|
| 0 | 0 | 0 | H | L | H | H |
| 0 | 0 | 1 | H | L | H | L |
| 0 | 1 | 0 | H | Z | Z | Z |
| 0 | 1 | 1 | H | Z | Z | Z |
| 1 | 0 | 0 | L | H | L | L |
| 1 | 0 | 1 | L | H | L | H |
| 1 | 1 | 0 | L | Z | Z | Z |
| 1 | 1 | 1 | L | Z | Z | Z |

Figure 5:
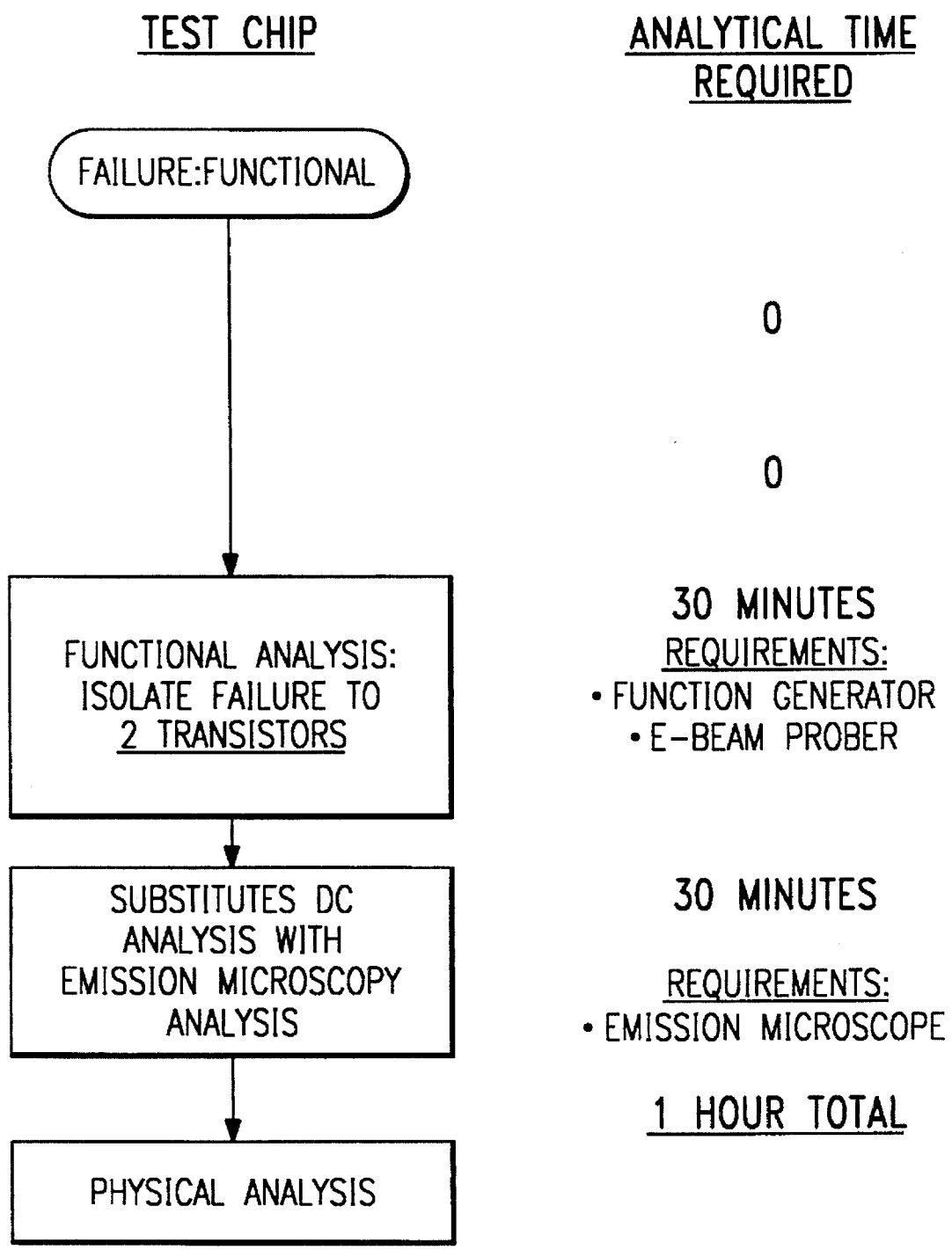
FIG. 5 is a flow chart of the functional failure analysis of an integrated circuit device, according to the present invention.

The time and equipment advantages to be gained may be best illustrated by examining the failure analysis test flow according to the present invention, as shown in FIG. 5. Upon indication of a functional failure by line yield fallout, qualification returns, or field returns, etc., functional failure analysis of the device must be performed. Using the test chip, it is not necessary to perform the packaging or test program modification steps which are necessary when dealing with an actual device; this saves anywhere from two to six days over the prior art flow. Functional analysis 13 using the test chip is capable of isolating the process-related defect to the defective electrical node and thus pinpointing the problem to two transistors. An E-Beam prober and an inexpensive function generator, rather than an expensive tester, are the only equipment necessary to perform the function analysis which may take only 30 minutes, as compared to the two to ten days of the prior art. Finally, an emission microscope is utilized to perform an emission microscopy analysis which will locate possible DC leakage related to silicon of the device. The emission microscopy analysis takes approximately 30 minutes and is thus considerably faster than the prior art DC analysis which typically takes up to a full day. Functional analysis and emission microscopy analysis together may be completed in one hour; this represents a significant improvement over functional analysis on real devices which could take anywhere from five to seventeen days. As will be appreciated by one skilled in the art, the functional analysis and emission microscopy analysis may even be performed in less than one hour.

While the invention has been particularly shown and described with reference to a preferred embodiment, it will be understood by those skilled in the art that various changes in form and detail may be made therein without departing from the spirit and scope of the invention. As will be understood by one skilled in the art, the testing methodology of the present invention may be implemented using a variety of different test chip types, in addition to the test chip described herein.

What is claimed is:

1. A method for quickly assessing the functionality and defect density of an integrated circuit device, comprising the steps of:

performing a functional analysis of an integrated circuit device using a test chip by locating a defective node comprised of a first transistor and a second transistor, wherein the integrated circuit device has a defect density which may be measured and the test chip has a plurality of elements and wherein the functional analysis uses an Electron Beam (E-Beam) to locate the defective node on the test chip; and assessing the defect density of the integrated circuit device.

2. The method of claim 1, wherein the test chip is a Sea-of-Gates ASIC based test chip.

3. The method of claim 1, wherein the functional analysis of the integrated circuit device is performed in less than one (1) hour.

4. The method of claim 1, wherein the test chip may be programmed to obtain a desired level of resolution of the defect density by setting a control pin of the test chip.

5. The method of claim 4, wherein setting the control pin of the test chip to a first logic level programs the test chip to a single chain mode and setting the control pin of the test chip to a second logic level programs the test chip to a multiple chain mode.

6. The method of claim 5, wherein the single chain mode provides a lower level of resolution of the defect density, allowing the defect density of the integrated circuit device to be quickly assessed, and the multiple chain mode provides a higher level of resolution of the defect density.

7. The method of claim 5, wherein in the single chain mode, the test chip is characterized as having one input signal and one output signal, and the elements of the test chip are connected together serially in a single chain.

8. The method of claim 5, wherein in the multiple chain mode, the test chip is characterized as having one input signal and a plurality of output signals, and the elements of the test chip are grouped in a plurality of chains wherein the elements of each chain are connected together serially and each chain has at least one output signal.

9. The method of claim 1, comprising the further step of:

performing an emission microscopy analysis of the integrated circuit device in order to locate a DC leakage condition.

10. The method of claim 9, wherein the emission microscopy analysis of the integrated circuit device is accomplished utilizing an emission microscope.

11. The method of claim 9, wherein the DC leakage condition is indicative of a process-related defect.

12. A method for quickly assessing the functionality and defect density of an integrated circuit device, comprising the steps of:

performing a functional analysis of an integrated circuit device using a test chip by locating a defective node comprised of a first transistor and a second transistor, wherein the integrated circuit device has a defect density which may be measured and the test chip has a plurality of elements and wherein the functional analysis uses an Electron Beam (E-Beam) to locate the defective node on the test chip;

assessing the defect density of the integrated circuit device by programming the test chip to be in a single chain mode or a multiple chain mode; and performing an emission microscopy analysis of the integrated circuit device in order to locate a DC leakage condition which is indicative of a process-related defect.

13. The method of claim 12, wherein the test chip is a Sea-of-Gates ASIC based test chip.

14. The method of claim 12, wherein the functional analysis of the integrated circuit device is performed in less than one (1) hour.

15. The method of claim 12, wherein the test chip may be programmed to obtain a desired level of resolution of the defect density by setting a control pin of the test chip.

16. The method of claim 15, wherein setting the control pin of the test chip to a first logic level programs the test chip to the single chain mode and setting the control pin of the test chip to a second logic level programs the test chip to the multiple chain mode.

17. The method of claim 16, wherein the single chain mode provides a lower level of resolution of the defect density, allowing the defect density of the integrated circuit device to be quickly assessed, and the multiple chain mode provides a higher level of resolution of the defect density.

18. The method of claim 16, wherein in the single chain mode, the test chip is characterized as having one input signal and one output signal, and the elements of the test chip are connected together serially in a single chain.

19. The method of claim 16, wherein in the multiple chain mode, the test chip is characterized as having one input signal and a plurality of output signals, and the elements of the test chip are grouped in a plurality of chains wherein the elements of each chain are connected together serially and each chain has at least one output signal.

20. The method of claim 12, wherein the emission microscopy analysis of the integrated circuit device is accomplished utilizing an emission microscope.

* * * * *